United States Patent
Asai et al.

(10) Patent No.: US 6,240,636 B1
(45) Date of Patent: Jun. 5, 2001

(54) METHOD FOR PRODUCING VIAS IN THE MANUFACTURE OF PRINTED CIRCUIT BOARDS

(75) Inventors: Tsutomu Asai, Ageo; Fujio Kuwako, Urawa; Shinichi Obata, Ina-machi, all of (JP)

(73) Assignee: Mitsui Mining & Smelting Co., Ltd. (JP)

( * ) Notice: Subject to any disclaimer, the term of this patent is extended or adjusted under 35 U.S.C. 154(b) by 0 days.

(21) Appl. No.: 09/281,331

(22) Filed: Mar. 30, 1999

(30) Foreign Application Priority Data

Apr. 1, 1998 (JP) .................................................. 10-104216

(51) Int. Cl.$^7$ ..................................................... H01K 3/10
(52) U.S. Cl. ................................. 29/852; 29/830; 29/846; 427/97
(58) Field of Search ............................. 29/852, 830, 846; 216/17, 20, 36; 427/97; 174/255, 261, 262, 265, 266

(56) References Cited

U.S. PATENT DOCUMENTS

| 5,617,629 | 4/1997 | Ekström . |
| 5,690,837 * | 11/1997 | Nakaso et al. ........................ 29/852 |

FOREIGN PATENT DOCUMENTS

| 0 342 669 A2 | 11/1989 | (EP) ................................. H05K/3/02 |
| 0 741 505 A2 | 11/1996 | (EP) ................................. H05K/3/46 |
| 4-3676 | 1/1992 | (JP) ................................. H05K/3/46 |
| 404282887 * | 10/1992 | (JP) ........................................ 29/852 |
| 406302954 * | 10/1994 | (JP) ........................................ 29/852 |
| 10-075069 | 3/1998 | (JP) ................................. H05K/3/46 |
| WO 97/41713 | 11/1997 | (WO) ............................... H05K/3/02 |

OTHER PUBLICATIONS

"Structuring Of Laminated Cu–Polyimide Films Via Laser Ablation," *IBM Technical Disclosure Bulletin*, vol. 37, No. 8, p. 481 (Aug. 1994).

Kestenbaum, Ami, et al., "Laser Drilling Of Microvias In Epoxy–Glass Printed Circuit Boards," *IEEE Transactions on Components, Hybrids, and Manufacturing Technology*, vol. 13, No. 4, pp. 1055–1062 (Dec. 1990).

Pargellis, A. N., et al., "Formation Of Microvias In Epoxy-–Glass Composites By Laser Ablation," *Optics & Laser Technology*, vol. 22, No. 3, pp. 205–207 (Jun. 1990).

* cited by examiner

*Primary Examiner*—Gregory L. Huson
*Assistant Examiner*—Rick Kiltae Chang
(74) *Attorney, Agent, or Firm*—Jenkens & Gilchrist

(57) ABSTRACT

In a process producing a multi-layer printed wiring board, an inner core having at least one wiring pattern on its surface and an outer layer of copper foil are laminated with an organic insulating layer interposed therebetween, a via hole is formed using a laser beam, and the outer copper foil and the inner wiring patterns are electrically connected to each other by depositing copper. The process is characterized in that the outer layer of copper foil has a thickness of no more than one-fifth of the thickness of the inner wiring pattern, but will not exceed 7 μm, preferably 4 μm. The hole is formed in both the copper foil and the insulating layer simultaneously by irradiating with a laser beam on the outer layer of copper foil.

6 Claims, 2 Drawing Sheets

METHOD FOR PRODUCING VIAS IN THE MANUFACTURE OF PRINTED CIRCUIT BOARDS

FIELD OF THE INVENTION

The present invention relates to a method of making multi-layer printed wiring boards, more particularly, to a method wherein a via hole is easily formed in the multi-layer printed wiring board using a laser, while improving the adhesion between an outer wiring made from plated copper (a copper layer) and an insulating resin (a thermosetting resin layer) which is present between the outer wiring and the inner wiring.

BACKGROUND OF THE INVENTION

As electronic equipment becomes smaller and lighter with higher performance, it is necessary to reduce the width of wiring lines and the diameter of the via holes which connect layers in multi-layer printed wiring boards. It is extremely difficult to use mechanical drilling to form holes below about 200 $\mu$m diameter, and lasers have been used to make such small holes.

A carbon dioxide laser can form holes at high speed in organic substances, such as epoxy resin and polyimide resin. Such lasers have been widely used in making printed wiring boards. Forming holes in thick copper foil is difficult, however, because the copper foil reflects the laser beam. To solve this problem, as disclosed in Japanese Patent Publication No. 4-3676, a hole is etched through the copper foil having the same diameter as the via hole to be made. Then, the laser beam is used to form the hole through the organic substrate, with the beam diameter being larger than that of the via hole.

In the method of Japanese Patent Publication No. 4-3676, since it is necessary that a hole having the same diameter is etched through the copper foil, followed by irradiating with the laser beam to form the via hole, etching must be done twice, i.e., first, for forming the via hole in the copper foil and, second, for forming the wiring pattern. The repeated etching in such a process results in a serious loss of productivity. This may be compared with the use of conventional mechanical drilling wherein the etching is done only once, that is, for forming the wiring pattern. Furthermore, it is not easy to etch a hole in an outer wiring so as to align the hole with inner pad, because highly accurate alignment is required.

In another process, the faces of an inner insulating layer board which have inner wiring patterns are coated with an insulating resin, and holes are formed in the resin by the laser beam, and then the resin surfaces are directly plated with copper to form an outer copper layer. Only a single layer of copper is deposited. In this process, however, it is necessary to roughen the surfaces of the insulating resin layers formed by applying the insulating resin to obtain acceptable adhesive strength between the plated copper and the insulating resin layer. Roughening of the insulating resin surfaces often cannot provide sufficient adhesive strength between the copper layer and the insulating resin layer.

The present invention solves the above problems of the prior art, and provides a process for making multi-layer printed wiring boards, in which via holes are easily formed with a laser, and adhesion between the outer wiring pattern formed from the plated copper layer and the insulating resin layer between the outer wiring pattern and the inner wiring pattern is improved.

SUMMARY OF THE INVENTION

The inventors earnestly studied the above problems associated with the prior art and have found that a hole can be formed quickly in the outer copper layer and the insulating resin layer without damaging the inner wiring pattern by the method of making a multi-layer printed wiring board in which an inner core comprising an inner wiring pattern and an outer layer of copper foil are laminated with an organic insulating resin layer between the inner wiring pattern and the outer layer of copper foil to form a multi-layer board (a), a via hole is formed on the multi-layer board (a) by irradiating with the laser beam, and the outer layer of copper foil and the inner circuit pattern are electrically connected to each other by depositing copper on the multi-layer board (b) having the via hole, wherein the thickness of said outer layer of copper foil is no more than a specific thickness and said via hole is formed in both said outer layer of copper foil and said insulating resin layer simultaneously by irradiating with a laser beam, preferably a carbon dioxide laser. The present invention has been made on the basis of the findings.

That is, the method for making a multi-layer printed wiring board of the present invention is one in which an inner core comprising an inner wiring pattern and an outer layer of copper foil are laminated with an insulating resin layer between the inner wiring pattern and the outer layer of copper foil to form a multi-layer board (a), a via hole is formed on the multi-layer board (a) by irradiating with a laser beam, and the outer copper foil and the inner wiring pattern are electrically connected to each other by depositing copper on the multi-layer board (b) having the via hole, wherein the thickness of said outer copper foil is no more than one-fifth of the thickness of said inner wiring pattern, but will not exceed 7 $\mu$m, preferably 4 $\mu$m, and said via hole is formed in both said outer copper foil and said insulating resin layer simultaneously by irradiating with a laser beam, preferably a carbon dioxide laser.

DESCRIPTION OF ILLUSTRATIVE EMBODIMENTS

The method for producing multi-layer wiring board according to the present invention will be described below with referring to FIGS. 1 and 2.

Figure 1:
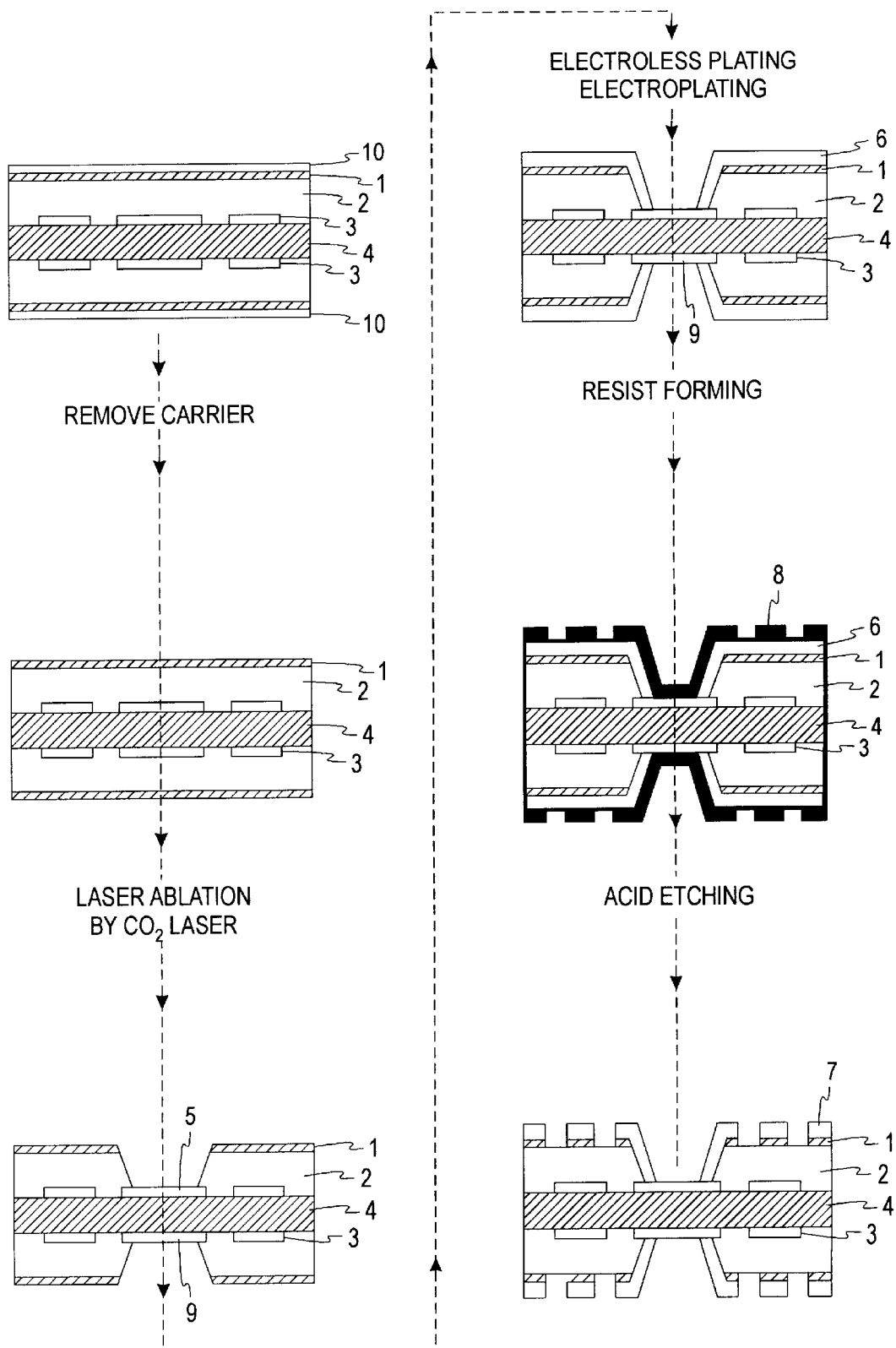
FIG. 1 shows steps (i)–(v) of a panel plating process for making a multi-layer printed wiring board in accordance with the present invention.

FIG. 1 shows steps of a panel plating process for making a multi-layer printed wiring board in accordance with the present invention. FIG. 2 shows steps of a pattern plating process for making a multi-layer printed board, in accordance with the present invention. In these FIGS. 1 and 2, there are shown a carrier 10 for copper foil 1, insulating resin layer 2, inner wiring pattern (circuit) 3, inner resin layer 4, via hole 5, outer copper layer 6, outer wiring pattern (circuit) 7, etching resist pattern 8, and pad 9.

In the method for preparing multi-printed wiring boards according to the present invention, first, a multi-layer board (a) is prepared by laminating an inner core comprising an inner wiring pattern 3 and an outer layer of a copper foil 1 with a organic insulating layer 2 between the inner wiring pattern and the outer layer of copper foil (see FIG. 1(i)). The inner core shown in FIG. 1(i) comprises two inner wiring patterns 3 and an inner resin layer 4.

The lamination of the inner core comprising the inner wiring pattern 3 and the outer layer of copper foil 1 with the insulating resin layer 2 is carried out, for example, by the following procedure.

1) A thermosetting resin varnish is applied on a surface of an outer layer of ultrathin copper foil 1 supported by a carrier 10 (a supporting member) in which the outer layer of ultrathin copper foil 1 having a thickness of no more than one-fifth of the thickness of the inner wiring pattern, but not exceeding 7 μm, preferably 4 μm, is laminated on the carrier 10 (for example, a supporting metal foil) having an organic release layer to form the thermosetting resin layer (insulating resin layer) 2. Then, the thermosetting resin layer 2 is heated at a temperature of 140–150° C. for 5–20 minutes to a semi-cured state (B-stage) to prepare a composite copper foil. As a base polymer of the thermosetting resin varnish, epoxy resin (for example, Epicoate 1001, produced by Yuka Shell Co., Ltd.) and the like, can be used. The thermosetting resin varnish for forming the thermosetting resin layer 2 may be an epoxy resin composition which contains the epoxy resin, dicyandiamide as a hardener, a hardening accelerator (for example, 2E4MZ, produced by Shikoku Kasei Co., Ltd.), and methyl ethyl ketone as a solvent. The epoxy resin composition can be prepared by appropriately mixing the above components. Alternatively, as the thermosetting resin layer, a prepreg made by impregnating with thermosetting resin, a fiber matrix, such as glass cloth, aramide paper, or the like, or a thermosetting resin film can be used. The thickness of the thermosetting resin layer 2 is preferably in a range of 20–200 μm. If the thermosetting resin layer 2 is thinner than 20 μm, sufficient interlayer insulation and adhesive strength cannot be obtained. If the thermosetting resin layer 2 is thicker than 200 μm, it is difficult to form a via hole having a small diameter.

The coated composite copper foil having the thermosetting resin layer 2 in the semi-cured state is disposed on one or both of the opposite faces of the inner core 4 so as to allow the resin side of the composite copper foil to be used as a bonding face, then laminated by heating and pressing at a temperature of about 150–200° C.

Next, from the multi-layer board thus obtained, the carrier is removed, for example, by peeling off or etching to obtain a multi-layer board (a) as shown in FIG. 1(i).

2) Alternatively, the multi-layer board in FIG. 1(i) can be made by applying the thermosetting resin on the outer layer of copper foil without a carrier in the same manner as described above, said copper foil having a thickness of no less than 7 μm, laminating the copper foil on one or both opposite faces of the inner core, followed by heat-pressing, and then partially dissolving the copper foil by etching to reduce the thickness of the outer layer of copper foil to no more than one-fifth of the thickness of the inner wiring pattern, but not exceeding 7 μm, preferably 4 μm.

3) The multi-layer board in FIG. 1(i) can also be made by applying the thermosetting resin on an outer layer of copper foil with a carrier in the same manner as described above, said copper foil having a thickness of not less than 7 μm, laminating the copper foil on one or both opposite faces of the inner core, followed by heat-pressing, removing the carrier by etching or peeling off, and then partially dissolving by etching to reduce the thickness of the outer layer of copper foil to no more than one-fifth of the thickness of the inner wiring pattern, but not exceeding 7 μm, preferably 4 μm.

In this connection, although ultrathin copper foil having a thickness of 7 μm or less may be used without using a carrier, it is difficult to handle the copper foil without causing wrinkles or creases. Also, it is generally difficult to obtain the ultrathin copper foil without a carrier when the foil has a thickness of 7 μm or less.

In the present invention, the thickness of the copper foil for the outer layer should be no more than one-fifth of the thickness of the inner wiring pattern, but will not exceed 7 μm, preferably 4 μm. If the thickness of the copper foil used as the outer layer exceeds one-fifth of the inner wiring pattern, not only the insulating resin layer but also the inner wiring pattern are damaged when forming a hole with a laser beam, particularly a carbon dioxide laser beam, in the outer layer of copper foil and insulating resin layer at the same time. If the thickness of the copper foil exceeds 7 μm, many burrs are produced in the outer layer of copper foil during irradiation with the laser beam, which results in an unstable hole shape.

As the thickness of the outer layer of copper foil is increased, the energy supplied by the laser for forming a hole must be increased. The increased energy supply increases temperature. As a result, the resin between the outer layer of copper foil and the inner wiring pattern may be badly damaged. It is possible to increase the thickness of the inner wiring patterns to diffuse heat but, when the inner wiring patterns have a thickness exceeding 35 μm, if thickness of the outer layer of copper foil exceeds 7 μm, preferably 4 μm, the energy applied to the resin becomes too large and the periphery of the via hole swells. This swelling is caused by melting and thermal decomposition of the resin and is not desirable, because it can be a reason to reject the printed wiring board. Therefore, the thickness of the outer layer of copper foil should be no more than one-fifth of the thickness of the inner circuits, but will not exceed 7 μm, preferably 4 μm.

As the insulating resin layer for bonding the inner wiring pattern and the outer layer of copper foil, epoxy impregnated aramid paper (e.g., "Thermount," produced by Dupont Co., Ltd.), epoxy resin adhesive film (e.g., "AS3000," produced by Hitachi Kasei Co., Ltd.), or the like may be used.

The coated composite copper foil which is produced by applying a resin to the copper foil of the composite may be used as described above. Various thermosetting resins, such as epoxy, polyimide, polyphenylene ether, BT resin, and the like may be used as the resin. For general use multi-layer printed wiring boards, epoxy resin is the most suitable, considering both the cost and performance.

As the inner resin layer 4 in the present invention, there can be used various types of insulating layers, such as glass-epoxy, glass-polyimide, glass-polyester, aramid-epoxy, composites, and the like. It is necessary that the inner wiring pattern of the inner core on which the outer layer of copper foil is laminated with the resin has a thickness not less than five times of that of the outer layer of copper foil. If the thickness of the inner wiring pattern is less than five times of that of the ultrathin copper foil, the inner wiring pattern cannot stand the heat generated by irradiating with a laser beam to form a hole and, as a result, the wiring pattern may be badly damaged and the inner resin layer under the inner wiring pattern may swell.

The via holes 5 are formed in both the outer layer of copper foil 1 and the insulating resin layer 2 simultaneously by irradiating the multi-layer board (a) as shown in the FIG. 1(i) with the laser beam to form a multi-layer board (b) having a hole (see FIG. 1(ii)). A carbon dioxide laser is preferably used, but the invention is not especially limited to this laser. A desmearing treatment can be applied, if necessary, after forming the hole by irradiating with the laser beam.

After forming each via hole 5, the multi-layer board (b) having the hole is subjected to electroless plating using a copper pyrophosphate plating solution (for example, OPC-750 electroless copper plating solution, produced by Okuno Seiyaku Co., Ltd.), at a solution temperature of 20–25° C., for 15–20 minutes to form a layer of electroless copper having a thickness of approximately 0.1 $\mu$m. The electroless copper layer is formed also on the resin surface of each via hole 5. Thereafter, an electroplating solution including 30–100 g/L of copper and 50–200 g/L of sulfuric acid at a temperature of 30–80° C. with a cathode current density of 10–100 A/dm$^2$, can be used to form an outer copper layer 6 having a thickness of 5–35 $\mu$m, as shown in FIG. 1(iii). The outer copper layer 6 is electroplated also on the resin surface of the via hole 5. The outer layer of copper foil 1 has a strong bond strength with the insulating resin layer 2. Therefore, since the outer copper layer 6 has strong bond strength to the outer layer of copper foil, the adhesion strength between the insulating resin layer 2 and the outer copper layer 6 is higher than the case where the outer copper layer 6 is electroplated directly to the resin layer 2.

In a typical process, a photoresist (for example, Microposit 2400, produced by Shiplay Co., Ltd.) is applied on the surface of the outer copper layer 6 to a thickness of approximately 7 $\mu$m and dried. Then, the photoresist is exposed to radiation through a photomask having a predetermined wiring pattern to form an exposed part and an unexposed part. After radiating, the photoresist is developed using 10% KOH solution to partially expose copper to form a resist pattern 8 (see FIG. 1(iv)). The exposed copper is then acid etched, using a solution including 100 g/L of CuCl$_2$ and 100 g/L of free hydrochloric acid at a temperature of 50° C. to partially dissolve the outer layer of copper foil 1 and the outer copper layer 6 thereby forming the outer wiring pattern 7. The outer wiring pattern 7 thus obtained is electrically connected to a pad 9 in the inner wiring pattern 3.

Finally, the photoresist coated on each outer wiring pattern 7 is removed at a temperature of 50° C. using a 3% NaOH solution to obtain a multi-layer printed wiring board as shown in FIG. 1(v).

The thickness of the outer layer of copper foil 1 is especially thin, and therefore, the etching performance is remarkably improved to easily produce a fine wiring pattern.

Figure 2:
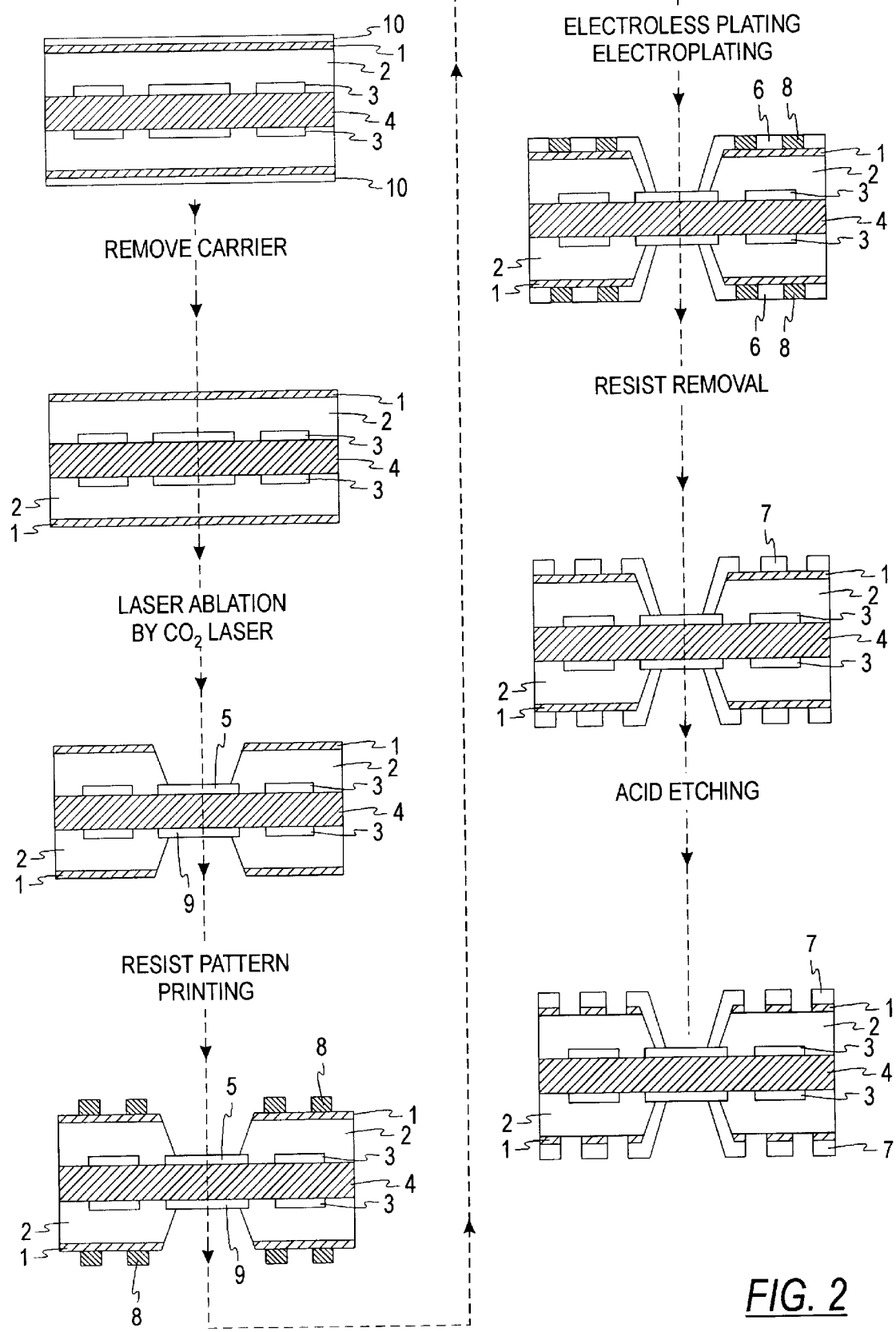
FIG. 2 shows steps (i)–(vi) of a pattern plating process or semi-additive process for making a multi-layer printed wiring board in accordance with the present invention.

As another process, a pattern plating process or a semi-additive process as shown in FIG. 2 will be described. FIGS. 2(i) and (ii) are the same as FIGS. 1(i) and (ii), respectively. On the multi-layer board (b) having a via hole 5, photoresist is applied or laminated, and exposed through a photomask, followed by developing to form a photoresist pattern 8. This exposes the outer layer of copper foil 1 at position(s) corresponding to the outer wiring pattern and the inner wiring pattern corresponding to a pad 9 (see FIG. 2(iii)). The copper layer 6 is made by electroless plating, followed by electroplating, as discussed above, to form an outer copper layer 6 which contacts both the inner and the outer wiring patterns (see FIG. 2(iv)). When the photoresist is removed using 3% NaOH solution after the electroplating steps, the wiring pattern 6 is formed and the outer layer of copper foil 1 is exposed on the resin layer 2 between the copper wires (see FIG. 2(v)).

In the present invention, since the outer layer of copper foil 1 is very thin compared with the outer wiring pattern 7, it is possible to remove the outer layer of copper foil between the wires without protecting the outer wiring pattern 7 by tin plating, since only a short time is required when using an acid etching solution, such as cupric chloride or ferric chloride (see FIG. 1 (v)). The undercutting of the wiring is reduced, and the accuracy of the wiring patterns is improved.

The present invention may also be applied to an inner core having three or more layers. Furthermore, a layer having a via hole formed by the laser as described above may be multi-layered by repeating the steps of lamination, forming a hole by laser, plating, and patterning. Therefore, the present invention can be applied to production of multi-layer printed wiring boards having any number of layers.

In the present invention, after the ultrathin copper foil supported by the carrier has been bonded to the inner core and the carrier has been removed, a fine roughening treatment may be applied to the outer surface of the copper foil using known processes, such as a black oxide treatment, a treatment to produce red copper oxide, or the MECetch-BOND treatment produced by Meck Co., Ltd., to improve absorption of the laser and to facilitate forming of the via hole with the laser.

The laser used in the present invention is not particularly limited and use can be made of various carbon dioxide lasers such as NLC-1B21, produced by Hitachi Seiko Co., Ltd., IMPACT MODEL L500, produced by Sumitomo Juki Co., Ltd., or ML 505DT, produced by Mitsubishi Denki Co., Ltd.

Effect Of The Invention

As described above, according to the method for producing multi-layer printed wiring boards of the present invention, via holes can be directly formed without first forming a hole on the surface of the copper foil before irradiating with a laser beam and, as a result, productivity of the multi-layer printed wiring board is extremely improved.

The present invention will be explained more specifically using Examples and Comparative Examples.

EXAMPLE 1

The epoxy resin composition shown in Table 1 was applied on a face of an ultrathin copper foil supported by a carrier (supporting copper foil), in which an organic release layer (carboxy benzotriazole) is present between the supporting copper foil and the ultrathin copper foil (the thickness of the supporting copper foil: 35 $\mu$m, the thickness of the ultrathin copper foil: 4 $\mu$m). The thickness of the epoxy resin composition was 60 $\mu$m. The coated copper foil was dried in an oven for 8 minutes at a temperature of 135° C. until semi-cured to obtain a copper foil.

TABLE 1

| Composition | Amount |
| --- | --- |
| Epoxy Resin (Epicoat 1001 produced by Yuka Shell Co., Ltd.) | 100 parts |
| Phenoxy Resin (produced by Touto Kasei Co., Ltd.) | 15 parts |
| Hardener Dicyandiamide | 2.5 parts |
| Hardening Accelerator 2E4MZ (produced by Shikoku Kasei Co., Ltd.) | 0.2 parts |

Next, using conventional processing, inner wiring patterns having a thickness of 18 $\mu$m were formed on opposite faces of an FR-4 matrix (R-1766 produced by Matsushita Denko Co., Ltd.) having a thickness of 0.5 mm to obtain an inner core. Then a black oxide treatment was applied to the wiring patterns The resin coated composite copper foil was laminated on each of opposite faces of the inner wiring patterns so that the resin face was between the ultrathin copper foil and the inner wiring pattern. The lamination was carried out for 60 minutes at a temperature of 180° C. and under a pressure of 20 kg/cm² using a vacuum press. After peeling off the support member from the copper foil, a four layer plate was obtained having embedded inner wiring patterns.

Four pulses of a carbon dioxide laser (ML 505DT, produced by Mitsubishi Denki Co., Ltd.) were irradiated at a predetermined position on the outer layer copper foil face of the four layer plate described above and a via hole was formed. The laser beam's diameter was 220 μm, the electric current was 12 A, and pulse width was 50 μsec.

EXAMPLE 2

A copper foil having a thickness of 35 μm was laminated on each of the opposite faces of an FR-4 matrix (R-1766, produced by Matsushita Denko Co., Ltd.) having a thickness of 0.5 mm as core material. Inner wiring patterns were formed from the copper foil using conventional processing and then a black oxide treatment was applied.

Next, two sheets of copper foil with an aluminum carrier (UTC40E9, produced by Mitsui Mining & Smelting Co., Ltd.), made by electrodepositing copper with a thickness of 9 μm on a 40 μm thick aluminum carrier, were laminated on the inner wiring patterns with an intermediate insulating layer of FR-4 glass-epoxy prepreg (R-1661, produced by Matsushita Denko Co., Ltd.) having a thickness of 0.1 mm. After laminating under the same conditions as in Example 1, alkaline etching with a 5% NaOH solution was used to dissolve the aluminum carrier, thus producing a four layer plate having embedded inner wiring patterns.

Then, a cupric chloride solution was applied to the four layer plate, and the whole face of the outer copper foil was partially dissolved to leave a thickness of 4 μm.

Seven shots of the laser beam were irradiated at a predetermined position of the outer copper foil face, as in Example 1, to form a via hole.

COMPARATIVE EXAMPLE 1

Example 1 was repeated, except that copper foil (3EC, produced by Mitsui Mining & Smelting Co., Ltd.) with a thickness of 9 μm, was employed as the outer copper foil, instead of the ultrathin copper foil with a carrier used in Example 1. Epoxy resin was placed on the surface of the foil as in Example 1 to obtain a copper foil coated with resin.

Next, inner wiring patterns having a thickness of 35 μm were formed on opposite faces of an FR-4 matrix (R-1766, produced by Matsushita Denko Co., Ltd.) having a thickness of 0.5 mm to obtain an inner core, and a black oxide treatment was applied. The copper foil coated with resin was laminated on each of opposite faces of the inner wiring patterns of the inner core so that the resin face was adjacent to the inner wiring patterns, followed by the same steps as in Example 1 to obtain a four layer plate having embedded inner wiring patterns.

Although eight pulses of the carbon dioxide laser were used under the same conditions as in Example 1 at a predetermined position of the outer layer of copper foil, the shape of the via holes was not uniform, and a via hole could not be formed at some positions. When the number of pulses was increased, the resin was badly damaged by the heat of the laser. Even where a via hole could be formed, a larger hole was formed in the resin between the copper foil and the resin matrix, as compared with the opening in the copper foil surface, that is, the copper foil was undercut, which results in serious difficulties in plating the via hole in later steps.

COMPARATIVE EXAMPLE 2

Two sheets of FR-4 glass-epoxy prepreg (R-1661, produced by Matsushita Denko Co., Ltd.) with a thickness of 0.1 mm were laid on the rough surface side of a copper foil (3EC, produced by Mitsui Mining & Smelting Co., Ltd.) having a thickness of 9 μm. Another sheet of copper foil with a thickness of 9 μm was laid on the sheets of the FR-4 glass-epoxy prepreg with its rough face turned toward the prepreg. The superposed sheets of the FR-4 glass-epoxy prepreg and copper foils were laminated for 60 minutes at a temperature of 180° C. and under a pressure of 15 kg/cm² by means of a vacuum press machine to obtain a double-sided plate having the copper foils laminated on the outside of the FR-4 prepreg.

After forming inner wiring patterns with a thickness of 9 μm on opposite faces of the copper foil of the double-sided plate, using the same process as in Example 1, a black oxide treatment was applied. Then, the resin-coated ultrathin (4 μm) copper foil with a carrier, made as in Example 1, was laminated on each of the opposite faces of the circuits under the same conditions as in Example 1. After peeling off the carrier, a four layer plate having embedded inner wiring patterns was obtained.

The same number of pulses of a laser beam were used under the same conditions as in Example 1 at predetermined positions of the outer layer copper foil face of the four layer plate.

In appearance, the via holes similar to those in Example 1 were formed. In a cross section, however, delamination was observed between the inner wiring patterns and the inner resin layer where the laser beam was irradiated. This delamination develops further due to heat of solder reflowing, and may finally result in a break in the conductive path through the vias, which is a serious defect.

What is claimed is:

1. A method for making a multilayer printed wiring board comprising:

(a) laminating to an inner wiring pattern having a defined thickness greater than zero, an ultra-thin copper foil having two sides and a defined thickness greater than zero and supported on a carrier, one side of said foil being adjacent to said carrier and an opposite side of said foil having an organic insulating resin layer disposed thereon, said insulating layer being disposed between said inner wiring pattern and said copper foil, wherein a maximum thickness of said ultra-thin copper foil is a lesser of 7 μm or 1/4.5 times the thickness of the inner wiring pattern;

(b) removing said carrier to obtain the multilayer board having an outer copper foil layer and an insulating layer disposed on said inner wiring pattern; and then (c) forming a via hole through said outer copper foil layer and said organic insulating layer to said inner wiring pattern by simultaneously irradiating said copper foil and said organic insulating layer with a carbon dioxide laser.

2. The method of claim 1, further comprising steps of:

(d) electrically connecting said outer copper foil and said inner wiring pattern; and (e) forming an outer wiring pattern from said outer copper foil layer.

3. The method of claim 2, wherein said outer wiring pattern formed in step (e) is made by pattern plating.

4. The method of claim 2, wherein said outer wiring pattern formed in step (e) is made by panel plating.

5. The method of claim 1, wherein said ultra-thin copper foil is supported on a copper foil carrier and an organic release layer is disposed between the ultra-thin copper foil and the copper foil carrier and said carrier is removed by peeling.

6. The method of claim 1, wherein said ultra-thin copper foil is supported on an aluminum carrier and said aluminum carrier is removed by chemical etching.

* * * * *